(12) United States Patent
Yamada et al.

(10) Patent No.: US 6,562,183 B1
(45) Date of Patent: May 13, 2003

(54) ANTI-CORROSIVE PARTS FOR ETCHING APPARATUS

(75) Inventors: Hirotake Yamada, Anjo (JP); Sadanori Shimura, Kounan (JP); Tsuneaki Ohashi, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/543,932

(22) Filed: Apr. 6, 2000

(30) Foreign Application Priority Data

Apr. 7, 1999 (JP) ............................................. 11-100068

(51) Int. Cl.⁷ ............................................... C01B 31/36
(52) U.S. Cl. ..................................... 156/345.1; 428/408
(58) Field of Search ........................ 156/345; 428/408, 428/446, 698, 216, 334, 105

(56) References Cited

U.S. PATENT DOCUMENTS

| | | | |
|---|---|---|---|
| 5,043,773 A | * 8/1991 | Precht et al. ................... | 257/77 |
| 5,291,536 A | * 3/1994 | Itoh et al. ...................... | 378/35 |
| 5,861,346 A | * 1/1999 | Hamza et al. ............... | 438/769 |
| 5,904,778 A | * 5/1999 | Lu et al. .................. | 118/723 R |
| 5,993,770 A | * 11/1999 | Kuroyanagi et al. ........ | 423/345 |
| 6,063,513 A | * 5/2000 | Tanino ........................ | 428/698 |

FOREIGN PATENT DOCUMENTS

| JP | 56-45898 | * 4/1981 |
|---|---|---|
| JP | 60-96590 | * 5/1985 |
| JP | 361245558 A | * 10/1986 |
| JP | 9-153620 | * 6/1997 |

* cited by examiner

Primary Examiner—Gregory Mills
Assistant Examiner—Sylvia R. MacArthur
(74) Attorney, Agent, or Firm—Burr & Brown

(57) ABSTRACT

To prevent an exposed surface of an anticorrosive part for an etching apparatus from being corroded, even when a highly corrosive etching gas such as a chlorine-based or fluorine-based plasma gas is used, an anticorrosive part for the etching apparatus for effecting etching treatment is provided. The anticorrosive part includes an anticorrosive part substrate, and a film of silicon carbide covering that surface of the anticorrosive part substrate which is to be exposed to an etching gas, wherein the silicon carbide film is made of polycrystals of silicon carbide having a 3C crystalline system, and (111) planes of the silicon carbide polycrystals are oriented in parallel to the surface of the silicon carbide film.

15 Claims, 4 Drawing Sheets

ANTI-CORROSIVE PARTS FOR ETCHING APPARATUS

FIELD OF THE INVENTION

The present invention relates to anticorrosive parts for etching apparatuses.

BACKGROUND OF THE INVENTION

As cleaning gases for semiconductor-producing apparatuses, etching gases, such as chlorine-based gases and fluorine-based gases, have been used. A chamber for the etching apparatus is required to be anticorrosive against such an etching gas to thereby prevent generation of particles.

However, if the chamber of the etching apparatus is exposed to the chlorine-based or fluorine-based plasma gas at high temperatures, its inner face is likely to be corroded. In order to prevent the corrosion, there has been a demand for a chamber for the etching apparatus, which is highly anticorrosive against the etching gas so as to prevent the above corrosion. Further, beside the chambers in etching apparatuses, other anticorrosive parts for etching apparatuses have been required to be highly anticorrosive against the etching gas.

SUMMARY OF THE INVENTION

An object of the present invention is to provide an anticorrosive part for an etching apparatus which is not corroded at an exposed surface, even when a highly corrosive etching gas such as a chlorine-based or fluorine-based plasma gas is used.

The present invention is directed to the anticorrosive part for the etching apparatus for effecting etching treatment in which the surface of the anticorrosive part to be exposed to the etching gas is covered with a film of silicon carbide, and the silicon carbide film is made of polycrystals of silicon carbide having a 3C crystalline system, and (111) planes of the polycrystals are oriented parallel to the surface of the silicon carbide film.

DETAILED DESCRIPTION OF THE INVENTION

Figure 1:
FIG. 1 is a scanning electron microscope photograph of a film of silicon carbide used in Example 1 according to the present invention taken from a direction orthogonal to the surface of the film.

The present inventors discovered that when the surface of the anticorrosive part to be exposed to the etching gas was covered with a film of silicon carbide, and the silicon carbide film was made of polycrystals of silicon carbide having a 3C crystalline system with its (111) plane being oriented in parallel to the surface of the silicon carbide film, the exposed surface of the anticorrosive member was hardly corroded, even when used with a highly corrosive etching gas such as a chlorine-based or fluorine-based plasma gas at high temperatures. Consequently, the inventors reached the present invention.

Preferably, the silicon carbide film is a completely dense body having a high purity and a theoretical density. It is particularly preferable that the purity of the silicon carbide film is 99.9999 wt. % or more. What is meant by "99.9999 wt. % or more" is that the total amount of metal elements, excluding silicon carbide, is not more than 0.0001 wt %. In order to obtain such a dense body, a film of silicon carbide is preferably grown by chemical vapor deposition. The anti-corrosive part for the etching apparatus includes an etching chamber as well as an electrostatic chuck, a ring portion and roof to be located around an outer periphery of the electrostatic chuck, etc.

The substrate of which the anti-corrosive part for the etching apparatus is mainly composed is not particularly limited, but the following are particularly preferred:

(1) A sintered body composed mainly of silicon carbide. For example, (a) a sintered body composed of 90% or more of silicon carbide and having a relative density of not less than 90%, and (b) a porous sintered body composed of 90% or more of silicon carbide and having a relative density of 56% to 90%;

(2) A mixed sintered body of silicon carbide and metallic silicon;

(3) An insulating ceramic materials such as silicon nitride and aluminum nitride; and (4) Graphite.

Although the shape of the substrate is not particularly limited, a planar shape, a round shape, a square shape, a rectangular shape and the like may be used. The surface of the substrate upon which a film of silicon carbide is to be formed is preferably ground to an appropriate surface roughness.

The anticorrosive part for the etching apparatus according to the present invention may be produced by the following method:

(1) The temperature at which a film of silicon carbide is to be formed is 1250° C. to 1350° C.;

(2) A gas is fed at a Si/C molar ratio of 1.1 to 1.5;

(3) Hydrogen is flown as a carrier gas (argon, hydrogen) at an $H_2$/Si molar ratio of 3.5 to 4.5;

(4) The pressure inside a CVD furnace is set at 100 to 300 torr; and (5) The feed rate of the gas for a 1 $cm^2$ area of the substrate is set at $1\times10^{-5}$ to $1\times10^{-3}$ mol./min. as calculated in the form of silicon atoms.

If the producing conditions deviate from (1), (2), (3), (4) and (5), the (111) axis orientation disappears to degrade the corrosion resistance. Among the above, since the (111)-oriented CVD-SiC film contains a slight compression stress therein, a material having a coefficient of thermal expansion slightly lower than that of SiC, that is, a material having a coefficient of thermal expansion of 4.4 to 4.6 ppm/° C. (room temperature to 1000° C.), is more preferable.

The thickness of the silicon carbide film is preferably 50 μm or more. In this case, corrosion with the etching gas can be stably prevented over the entire exposure surface of the anticorrosive part. Further, the thickness of the silicon carbide film is preferably not more than 3000 μm mainly for economical reasons. The thickness of the silicon carbide film is preferably not less than 100 μm.

It is preferable that the volume of crystalline particles of silicon carbide having the crystalline grain sizes of 15 μm or more amounts to not more than 10 vol % of the entire volume of the silicon carbide polycrystals, and that the volume of crystalline particles having the crystalline grain sizes of 10 µm or more amounts to not more than 30 vol % of the entire volume of the silicon carbide polycrystals. It is also preferable that the volume of crystalline particles of silicon carbide having the crystalline grain sizes of 2 µm or less amounts to not more than 10 vol % of the entire volume of the silicon carbide polycrystals, and that the volume of crystalline particles of silicon carbide having the crystalline grain sizes of 3 µm or less amounts to not more than 30 vol % of the entire volume of the silicon carbide polycrystals.

Although the function and the effect of such a grain size distribution are not clear, it is considered that deviations in the (111) plane orientation can be avoided by reducing the ratio of the crystalline particles having the particle sizes of more than 10 µm and that of the crystalline particles having the particle sizes of less than 3 µm. For example, if many coarse grains exist, regions around them are likely to occur where the crystalline orientation is locally disturbed, so that corrosion may take place beginning from such areas. Further, if too-fine particles exist, it is considered that deviation is likely to take place in the crystalline orientation.

The method of measuring the particle size will be described. The surface of a film of silicon carbide is photographed by a scanning type electron microscope photograph with a magnification of 1000 times from a direction orthogonal to this surface. This photograph is enlarged twice in both lateral and vertical sizes to obtain a test photograph. Five or more arbitrary straight lines are drawn on this test photograph. Intersections between the straight lines and grain boundaries of each of grains through which the straight lines pass are evaluated. Since two intersections ordinarily exist for each grain, the distance between the two intersections is measured as a grain size for each grain.

It can be confirmed through an X-ray diffraction measurement that (111) planes of polycrystals of silicon carbide orient in a direction parallel to the surface of the silicon carbide film. That is, a diffraction intensity at the (111) plane is measured by irradiating specific X-rays from the surface side of the silicon carbide film, and diffraction intensities are also measured with respect to other crystalline planes belonging to a 3C crystalline system. The diffraction intensity at the (111) plane is a diffraction intensity at the (111) plane in JCPDS card No. 291129. In the 3C crystalline system, the (220) plane, the (311) plane and the (200) plane are ordinarily observed at 20° to −80° with Kα-Cu diffraction.

That the (111) planes of the silicon carbide polycrystals orient to the surface of the silicon carbide film does not exclude a case in the above measurement in which the crystalline planes other than the (111) plane locally orient in different directions. However, the proportion of the total diffraction intensity at the other crystalline planes to that at the (111) plane is preferably not more than 20%, and not more than 10.

As the etching gas to be favorably used in the present invention, chlorine-based corrosive gases such as $Cl_2$, $BCl_3$, $ClF_3$ and HCl and fluorine-based corrosive gases such as $ClF_3$ gas, $NF_3$ gas, $CF_4$ gas, $WF_6$ and $SF_6$ may be used. The present invention is particularly favorable for plasmas of such gases.

The temperature at which the anticorrosive part for the etching apparatus is exposed to the etching gas may be in a wide range from room temperature to 800° C. Particularly, the anticorrosive part for the etching apparatus according to the present invention exhibits high corrosion resistance even in a high temperature range of 500 to 800° C.

EXAMPLES

Example 1

A film of silicon carbide was formed on a surface of a substrate made of graphite by chemical vapor deposition. The substrate had a planar shape with opposite main surfaces each having a lateral size of 50 mm and a vertical size of 50 mm at a thickness of 8 mm. One main plane of the substrate was ground to a center line-average surface roughness, $R_a$ of less than 3 µm with a grinding stone of #800 or more. The substrate was inserted and placed in a chemical vapor deposition furnace. At that time, the opposite main planes of the substrate were set in parallel to a blow-out direction of a reactive gas. That is, the substrate was so set that a side face of the planar substrate was opposed to a blow-out opening.

Figure 2:
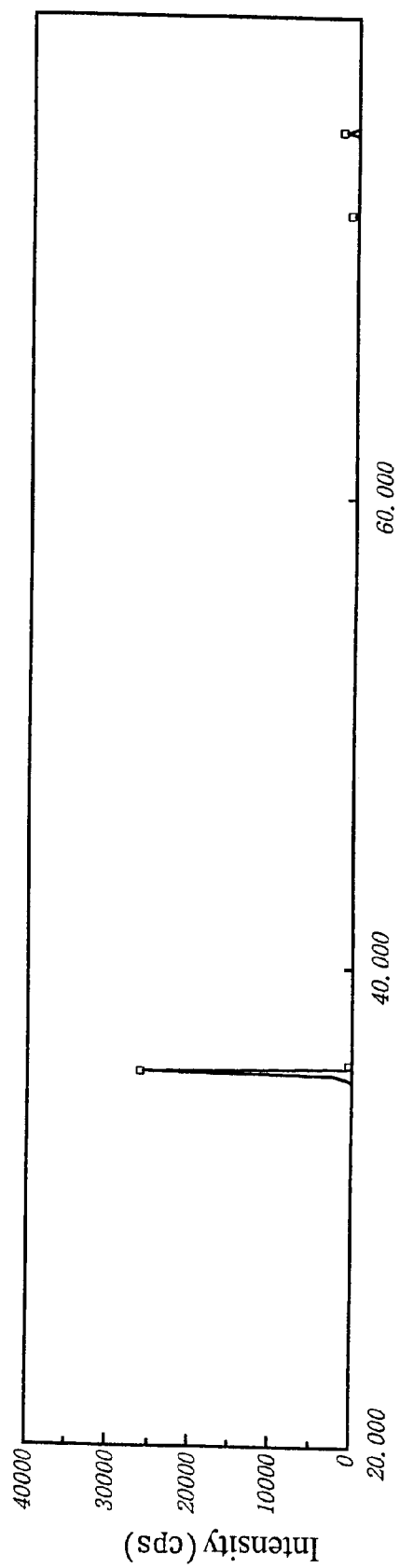
FIG. 2 is an X-ray diffraction chart of the silicon carbide film in FIG. 1 taken from a direction orthogonal to the surface of the film.

The inside of the furnace was evacuated to vacuum, and replaced with argon gas. Then, the furnace was heated up to a reacting temperature of 1300° C. (for film formation). Argon was used as a carrier gas, and $SiCl_4$ and $CH_4$ were introduced as reactive gases. The ratio of Si to C, i.e., Si/C=1.3, $H_2$/Si=4.0 mol ratio (molar ratio as calculated in a standard condition), and the Si feed rate was set at $1 \times 10^{-4}$ mol/cm²/min. The pressure inside the furnace was adjusted to 200 Torr. A film of silicon carbide was formed at a film thickness of 200 µm in 1.5 hours, followed by cooling. In Comparative Example 1, a film of silicon carbide was formed at a film thickness of 200 µm on a substrate in the same condition as in Example 1 except that the film-forming temperature was 1450° C., the pressure inside the furnace was 350 Torr, and the film-forming time was 1 hour. These silicon carbide films were photographed with a scanning type electron microphotograph (magnification: 1000 times) from a direction orthogonal to the surface thereof, and their photographs are shown in FIG. 1. An X-ray diffraction measurement was effected with the Kα-Cu rays, and a measurement result is shown in FIG. 2.

The particle size distribution of the particles of silicon carbide polycrystals were measured from the photograph in FIG. 1 as mentioned above. This result is shown in Table 1. The surface roughness was measured to be Ra=1.8 to 3.0 µm. As seen from FIG. 2, almost no diffraction peak is observed except a diffraction peak corresponding to the (111) plane at a diffraction angle of 35.6°. The proportion of the other diffraction peaks to that corresponding to the (111) plane was about 6%.

The proportion of Si in the silicon carbide was analyzed to be 70.12 to 7028 wt %. The analysis was effected as follows. This measuring method is described in JP-A 10-295,067 as an analysis method capable of accurately measuring the content of silicon.

That is, each test piece was ground to 3 mm or less, ground pieces were placed in a platinum dish, and sodium carbonate, boric acid and iron oxide were added thereto. Sodium carbonate and boric acid are fluxes use for melting silicon carbide. Iron oxide is a catalyst for promoting an oxidation reaction between silicon carbide and the fluxes. At this point in time, the silicon in the silicon carbide is converted to sodium silicate. Iron is considered to be converted to a sodium salt.

The resulting reaction mixture is dissolved in hydrochloric acid. Sodium silicate is insoluble in hydrochloric acid. Iron is converted to iron chloride, and dissolved in hydrochloric acid. Then, when polyethylene oxide is added to the hydrochloric acid, insoluble sodium silicate agglomerates to form a jelly precipitate composed mainly of sodium silicate.

Next, this precipitate is filtered and washed with warm water. Thereby, about 1% of the sodium silicate is dissolved during washing with warm water, which moves into the warm wash water (B). Sodium is washed by washing with warm water to change the precipitate of sodium silicate to $SiO_1$–$H_2O$ (hydrous silicic acid). Strong heating of this precipitate gives mainly a precipitate (A) containing $SiO_2$, while scattering off water and the filter paper.

Next, hydrofluoric acid is added to the precipitate mainly containing $SiO_2$, thereby evaporating silicon dioxide. This reaction proceeds with $SiO_2+4HF \rightarrow SiF_4$ (to be vaporized)+$2H_2O$. The residue is strongly heated, and a then remaining matter was weighed. From a difference between thus measured weight and the weight before the addition of hydrofluoric acid, the total weight of silicon dioxide present in the precipitate (A) is determined.

The amount of soluble silicon in the above warm water (B) is measured by a high frequency plasma emission analysis method. The measured weight of silicon present in the precipitate (A) and that of silicon present in the warm wash water (B) are summed to calculate the total amount of silicon.

The results in Table 1 were obtained by the following procedures. That is:

(1) A piece was cut in a shape of 10×10×5 from the sample without working the film-formed surface;
(2) The film surface was photographed from the direction orthogonal to the sample with the scanning type electron microscope (HITACHI S-2250N) in a secondary electron image magnification of 1000 times;
(3) The dimension of the photograph was enlarged twice vertically and laterally;
(4) Diagonal lines passing four corners and an intersection of the diagonal lines were drawn up to ends of a view field; and
(5) Intersections between grain boundaries and these segments were marked, and distances between the intersections were measured as particle sizes.

TABLE 1

| Particle size | Example 1 Volume (Vol. %) | Comparative Example 1 Volume (Vol. %) |
| --- | --- | --- |
| 15 μm or more | 5 | 15 |
| 10 μm or more | 25 | 60 |
| 3–10 μm | 60 | 35 |
| 3 μm or less | 15 | 5 |
| 2 μm or less | 3 | 2 |

A thin plate was cut out in a size of 0.15×2×40 μm from the film of Example 1 only, and its 4-terminal electric resistance was measured at room temperature, 100° C. and 200° C. Results are as follows.

TABLE 2

| Temperature (° C.) | Electric resistance (Ωcm) |
| --- | --- |
| 20 | 1000000 |
| 100 | 250000 |
| 200 | 20000 |

This silicon carbide film was exposed to a chlorine-based plasma gas together with the substrate. More specifically, $NF_3$ gas was converted to plasma with an inductively coupled plasma. The flow rate of the mixed gas was 75 SCCM, the pressure 0.1 Torr, the AC power 800 watts, its frequency 13.56 MHz, and the exposure time 2 hours. As a result, the weight of the silicon carbide decreased by 0.1 mg/cm². This weight decrease was measured according to the following equation: (weight of silicon carbide film before exposure—weight of silicon carbide film after exposure)/exposed area.

Comparative Example 1

A film of silicon carbide was formed on a surface of a substrate in the same manner as in Example. In Comparative Example 1, the surface of the substrate was not ground, so that the surface roughness was 5 μm. Further, the film-forming temperature was set at 1450° C. The other conditions were the same as Example 1.

Figure 3:
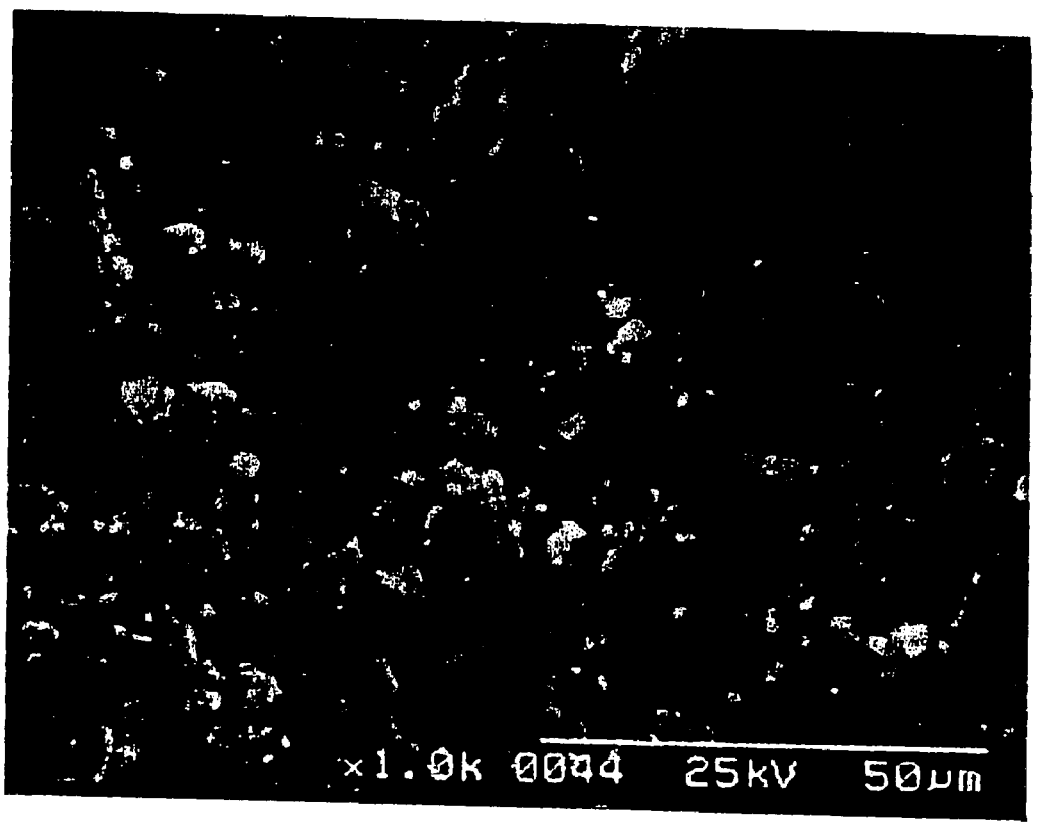
FIG. 3 is a scanning electron microscope photograph of a film of silicon carbide used in Comparative Example 1 taken from a direction orthogonal to the surface of the film.
Figure 4:
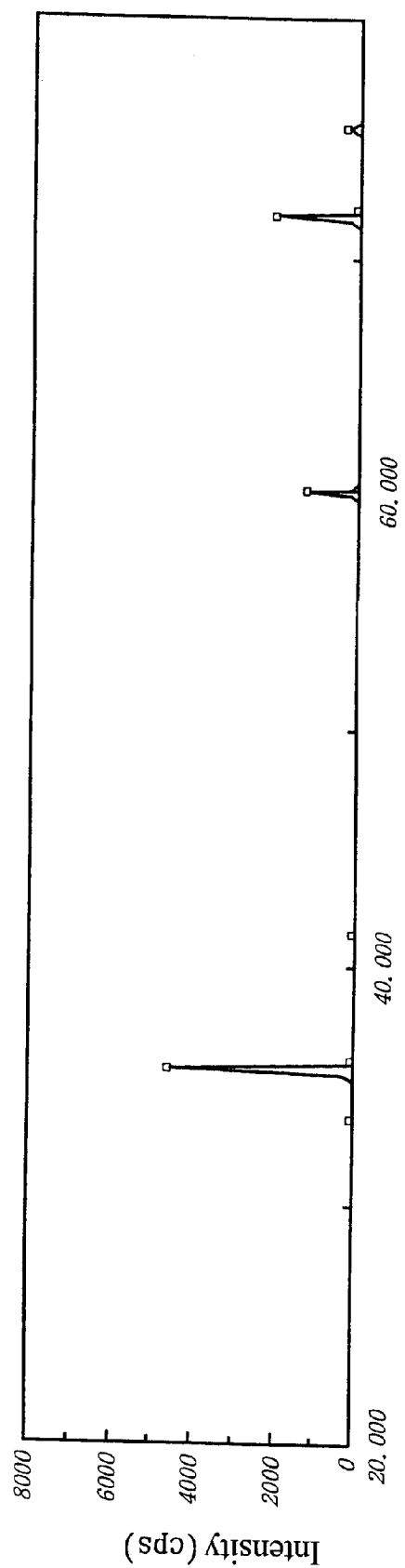
FIG. 4 is an X-ray diffraction chart of the silicon carbide film in FIG. 3 taken from a direction orthogonal to the surface of the film.

This silicon carbide film was photographed with the scanning type electron microphotograph (magnification: 1000 times) from a direction orthogonal to the surface thereof, and their photographs are shown in FIG. 3. An X-ray diffraction measurement was effected, and a measurement result is shown in FIG. 4.

The particle size distribution of the particles of silicon carbide polycrystals were measured from the photograph in FIG. 3 as mentioned above. This result is shown in Table 1. The surface roughness was measured to be Ra=3.4 to 5.5 μm. As seen from FIG. 4, the proportion of the other diffraction peaks to that corresponding to the (111) plane was about 51%.

The proportion of Si in the silicon carbide was analyzed to be 70.05 to 70.11 wt %.

A thin plate was cut out in a size of 0.15×2×40 μm from the film only of Comparative Example 1, and its 4-terminal electric resistance was measured at room temperature, 100° C. and 200° C. The results are as follows.

TABLE 3

| Temperature (° C.) | Electric resistance (Ωcm) |
| --- | --- |
| 20 | 200 |
| 100 | 40 |
| 200 | 20 |

This silicon carbide film was exposed to the chlorine-based plasma gas in the same manner as Example 1. As a result, the weight of the silicon carbide decreased by 0.5 mg/cm².

According to the present invention, the anticorrosive parts for the etching apparatus can be prevented from being corroded at the exposed surface thereof even when a highly corrosive etching gas such as the chlorine-based or flourine-based plasma gas is used.

What is claimed is:

1. An anticorrosion part for an etching apparatus for effecting etching treatment, said anticorrosive part comprising an anticorrosive part substrate, and a film of silicon carbide covering that surface of the anticorrosive part substrate which is to be exposed to an etching gas, wherein the silicon carbide film is made of polycrystals of silicon carbide having a 3C crystalline system, and (111) planes of the silicon carbide polycrystals are oriented in parallel to the surface of the silicon carbide film, wherein with respect to the entire volume of the silicon carbide polycrystals, the volume of crystalline particles of silicon carbide having grain sizes of 15 μm or more amounts to not more than 10 vol %, the volume of crystalline particles having grain sizes of 10 μm or more amounts to not more than 30 vol %, the volume of crystalline particles of silicon carbide having grain sizes of 2 μm or less amounts to not more than 10 vol %, and the volume of crystalline particles of silicon carbide having grain sizes of 3 μm or less amounts to not more than 30 vol %.

2. The anticorrosion part for an etching apparatus set forth in claim 1, wherein the silicon carbide film is formed by chemical vapor deposition.

3. The anticorrosion part for an etching apparatus set forth in claim 2, wherein a proportion of a total diffraction intensity at the other crystalline planes to that at the (111) planes of the silicon carbide polycrystals of the silicon carbide film is not more than 20% when measured by irradiation with specific X rays from a front surface side of the silicon carbide film.

4. The anticorrosion part for an etching apparatus set forth in claim 2, wherein the silicon carbide film has a film thickness of 50 to 3000 μm.

5. The anticorrosion part for an etching apparatus set forth in claim 2 wherein the substrate has a coefficient of thermal expansion of 4.4 to 4.6 ppm/° C. at 1000° C. with reference to a standard at 40° C.

6. The anticorrosion part for an etching apparatus set forth in claim 2, wherein the substrate comprises at least one material selected from the group consisting of:
   (1) a sintered body composed mainly of silicon carbide,
   (2) a mixed sintered body of silicon carbide and metallic silicon, (3) silicon nitride, (4) aluminum nitride, and (5) graphite.

7. The anticorrosion part for an etching apparatus set forth in claim 11, wherein the silicon carbide film has a film thickness of 50 to 3000 μm.

8. The anticorrosion part for an etching apparatus set forth in claim 1, wherein the substrate has a coefficient of thermal expansion of 4.4 to 4.6 ppm/° C. at 1000° C.

9. The anticorrosion part for an etching apparatus set forth in claim 1, wherein the substrate comprises at least one material selected from the group consisting of:
   (1) a sintered body composed mainly of silicon carbide,
   (2) a mixed sintered body of silicon carbide and metallic silicon, (3) silicon nitride, (4) aluminum nitride, and (5) graphite.

10. An anticorrosion part for an etching apparatus for effecting etching treatment, said anticorrosive part comprising an anticorrosive part substrate, and a film of silicon carbide covering that surface of the anticorrosive part substrate which is to be exposed to an etching gas, wherein the silicon carbide film is made of polycrystals of silicon carbide having a 3C crystalline system, and (111) planes of the silicon carbide polycrystals are oriented in parallel to the surface of the silicon carbide film, wherein
   the substrate comprises at least one material selected from the group consisting of: (1) a sintered body composed mainly of silicon carbide, (2) a mixed sintered body of silicon carbide and metallic silicon, (3) silicon nitride, (4) aluminum nitride, and (5) graphite, and the sintered body composed mainly of silicon carbide comprises (a) a sintered body composed of 90% or more of silicon carbide and having a relative density of not less than 90%, or (b) a porous sintered body composed of 90% or more of silicon carbide and having a relative density of 56% to 90%.

11. The anticorrosion part for an etching apparatus set forth in claim 10, wherein the anticorrosive part defines a chamber for the etching apparatus.

12. The anticorrosion part for an etching apparatus set forth in claim 6, wherein the anticorrosive part defines a chamber for the etching apparatus.

13. The anticorrosion part for an etching apparatus set forth in claim 1 wherein a proportion of a total diffraction intensity at the other crystalline planes to that at the (111) planes of the silicon carbide polycrystals of the silicon carbide film is not more than 20% when measured by irradiation with specific X rays from a front surface side of the silicon carbide film.

14. An anticorrosion part for an etching apparatus for effecting etching treatment, said anticorrosive part comprising an anticorrosive part substrate, and a film of silicon carbide covering that surface of the anticorrosive part substrate which is to be exposed to an etching gas, wherein the silicon carbide film is made of polycrystals of silicon carbide having a 3C crystalline system, and (111) planes of the silicon carbide polycrystals are oriented in parallel to the surface of the silicon carbide film, wherein
   a proportion of a total diffraction intensity at the other crystalline planes to that at the (111) planes of the silicon carbide polycrystals of the silicon carbide film is not more than 20% when measured by irradiation with specific X rays from a front surface side of the silicon carbide film.

15. An anticorrosion part for an etching apparatus for effecting etching treatment, said anticorrosive part comprising an anticorrosive part substrate, and a film of silicon carbide covering that surface of the anticorrosive part substrate which is to be exposed to an etching gas, wherein the silicon carbide film is made of polycrystals of silicon carbide having a 3C crystalline system, and (111) planes of the silicon carbide polycrystals are oriented in parallel to the surface of the silicon carbide film, wherein
   the silicon carbide film has a film thickness of 50 to 3000 μm, and a proportion of a total diffraction intensity at the other crystalline planes to that at the (111) planes of the silicon carbide polycrystals of the silicon carbide film is not more than 20% when measured by irradiation with specific X rays from a front surface side of the silicon carbide film. with reference to a standard at 40° C.

* * * * *